(12) United States Patent
Ishikawa

(10) Patent No.: US 7,663,956 B2
(45) Date of Patent: Feb. 16, 2010

(54) SEMICONDUCTOR MEMORY DEVICE

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 174 days.

(21) Appl. No.: 11/952,633

(22) Filed: Dec. 7, 2007

(65) Prior Publication Data

US 2008/0137463 A1 Jun. 12, 2008

(30) Foreign Application Priority Data

Dec. 12, 2006 (JP) ............................. 2006-335159

(51) Int. Cl.
*G11C 7/00* (2006.01)
(52) U.S. Cl. .............. 365/222; 365/230.03; 365/230.06
(58) Field of Classification Search ................. 365/222, 365/230.03, 230.06, 230.08, 189.05, 230.01, 365/185.11, 189.01, 196, 189.07, 193, 194
See application file for complete search history.

(56) References Cited

U.S. PATENT DOCUMENTS 5,991,218 A 11/1999 Kushiyama 6,888,776 B2 * 5/2005 Watanabe et al. ........... 365/194
2003/0112689 A1 6/2003 Natsui et al.
2007/0076504 A1 * 4/2007 Suh ............................ 365/222

FOREIGN PATENT DOCUMENTS

| JP | 7-122065 A | 5/1995 |
| JP | 11-39861 A | 2/1999 |
| JP | 2003-187578 A | 7/2003 |

* cited by examiner

*Primary Examiner*—Dang T Nguyen
(74) *Attorney, Agent, or Firm*—Sughrue Mion, PLLC

(57) ABSTRACT

A semiconductor memory device performs a refresh operation sequentially for a word line selected based on a row address when receiving a refresh request, and comprises: a memory cell array divided into M banks; a refresh counter for sequentially outputting a count value corresponding to the word line to be refreshed in response to the refresh request; and a row address converter for supplying row addresses different from one anther in at lest two banks among the M banks by converting the count value. In the semiconductor memory device, a predetermined number of selected word lines are refreshed at the same time in the banks in accordance with different patterns from one another, and the maximum value of the total number of the selected word lines refreshed at the same time for all the M banks is controlled to be lower than 2M.

10 Claims, 11 Drawing Sheets

FIG.4

FIRST EMBODIMENT : TRANSITION OF REFRESH OPERATION (SENARY COUNTER)

| COUNT VALUE OF REFRESH | | | | | UPPER 3 BITS OF A ROW ADDRESS | | | | | | | | | | | | TOTAL NUMBER OF SELECTED WORD LINES (4 BANKS) |
|---|---|---|---|---|---|---|---|---|---|---|---|---|---|---|---|---|---|
| | | | | | BANK A | | | BANK B | | | BANK C | | | BANK D | | | |
| C13 | ... | C2 | C1 | C0 | A13 | A12 | A11 | A13 | A12 | A11 | A13 | A12 | A11 | A13 | A12 | A11 | |
| 0 | ... | 0 | 0 | 0 | 0 | 0 | 0 | 1 | 0 | 1 | 1 | 1 | 0 | 1 | D | 1 | 5 |
| 0 | ... | 0 | 0 | 1 | 0 | 0 | 1 | 0 | 0 | 0 | 1 | 0 | 1 | 1 | 0 | 0 | 4 |
| 0 | ... | 0 | 1 | 0 | D | 1 | 0 | 0 | 0 | 1 | 0 | 0 | 0 | 1 | 0 | 1 | 5 |
| 0 | ... | 0 | 1 | 1 | D | 1 | 1 | D | 1 | 1 | 0 | D | 0 | 0 | 0 | 0 | 6 |
| 0 | ... | 1 | 0 | 0 | 1 | 0 | 0 | D | 1 | 0 | D | D | 1 | 0 | 0 | 1 | 6 |
| 0 | ... | 1 | 0 | 1 | 1 | 0 | 0 | 1 | 0 | 0 | 1 | 0 | 0 | D | D | 0 | 6 |
| 0 | ... | 0 | 0 | 0 | 0 | 0 | 0 | 0 | 0 | 0 | 1 | 0 | 1 | 1 | 0 | 1 | 5 |
| 0 | ... | 0 | 0 | 1 | 0 | 0 | 1 | 0 | 0 | 0 | 0 | 0 | 0 | 1 | 0 | 0 | 4 |
| 0 | ... | 0 | 1 | 0 | D | 1 | 0 | 0 | 0 | 1 | 0 | 0 | 0 | 1 | 0 | 1 | 5 |
| 0 | ... | 0 | 1 | 1 | D | 1 | 1 | D | 1 | 0 | 0 | 0 | 1 | 0 | 0 | 0 | 6 |
| 0 | ... | ... | ... | ... | ... | ... | ... | ... | ... | ... | ... | ... | ... | ... | ... | ... | ... |

↑ RESETTING THE SENARY COUNTER

D : don't care

FIG.6

FIRST EMBODIMENT : TRANSITION OF REFRESH OPERATION (SEPTENARY COUNTER)

| COUNT VALUE OF REFRESH | | | | | UPPER 3 BITS OF A ROW ADDRESS | | | | | | | | | | | | TOTAL NUMBER OF SELECTED WORD LINES (4 BANKS) |
|---|---|---|---|---|---|---|---|---|---|---|---|---|---|---|---|---|---|
| | | | | | BANK A | | | BANK B | | | BANK C | | | BANK D | | | |
| C13 | ... | C2 | C1 | C0 | A13 | A12 | A11 | A13 | A12 | A11 | A13 | A12 | A11 | A13 | A12 | A11 | |
| 0 | ... | 0 | 0 | 0 | 0 | 0 | 0 | 1 | 1 | 0 | 1 | 0 | 1 | 1 | 0 | 0 | 4 |
| 0 | ... | 0 | 0 | 1 | 0 | 0 | 1 | 0 | 0 | 0 | 1 | 1 | 0 | 1 | 0 | 0 | 4 |
| 0 | ... | 0 | 1 | 0 | 0 | 1 | 0 | 0 | 0 | 1 | 0 | 0 | 0 | 1 | 0 | 1 | 4 |
| 0 | ... | 0 | 1 | 1 | D | 1 | 1 | 0 | 1 | 0 | 0 | 1 | 0 | 0 | 0 | 0 | 5 |
| 1 | ... | 1 | 0 | 0 | 1 | 0 | 0 | 1 | 0 | 0 | 0 | 1 | 1 | 0 | 1 | 0 | 5 |
| 1 | ... | 1 | 0 | 1 | 1 | 1 | 0 | 1 | 0 | 1 | D | 1 | 1 | D | 1 | 0 | 5 |
| 0 | ... | 1 | 1 | 0 | 0 | 0 | 0 | 1 | 1 | 0 | 1 | 0 | 1 | 1 | 0 | 0 | 4 |
| 0 | ... | 0 | 0 | 0 | 0 | 0 | 1 | 0 | 0 | 0 | 1 | 0 | 0 | 1 | 0 | 0 | 4 |
| 0 | ... | 0 | 0 | 1 | 0 | 1 | 0 | 0 | 0 | 1 | 0 | 0 | 0 | 1 | 0 | 1 | 4 |
| 0 | ... | 0 | 1 | 0 | ... | ... | ... | ... | ... | ... | ... | ... | ... | ... | ... | ... | ... |

↑ RESETTING THE SEPTENARY COUNTER

D : don't care

FIG.8

FIRST EMBODIMENT : TRANSITION OF REFRESH OPERATION (QUINARY COUNTER)

| COUNT VALUE OF REFRESH | | | | | UPPER 3 BITS OF A ROW ADDRESS | | | | | | | | | | | | TOTAL NUMBER OF SELECTED WORD LINES (4 BANKS) |
|---|---|---|---|---|---|---|---|---|---|---|---|---|---|---|---|---|---|
| | | | | | BANK A | | | BANK B | | | BANK C | | | BANK D | | | |
| C13 | ...... | C2 | C1 | C0 | A13 | A12 | A11 | A13 | A12 | A11 | A13 | A12 | A11 | A13 | A12 | A11 | |
| 0 | ..... | 0 | 0 | 0 | 0 | 0 | 0 | 1 | 0 | 0 | D | 1 | 1 | D | 1 | 1 | 6 |
| 0 | ..... | 0 | 0 | 1 | D | 0 | 1 | 0 | 0 | 0 | 1 | 0 | 1 | D | 1 | 1 | 6 |
| 0 | ..... | 0 | 1 | 0 | D | 1 | 1 | D | 0 | 1 | 0 | 0 | 0 | 1 | 0 | 0 | 6 |
| 0 | ..... | 0 | 1 | 1 | D | 1 | 1 | D | 1 | 0 | D | 0 | 1 | 0 | 0 | 0 | 7 |
| 0 | ..... | 1 | 0 | 0 | 1 | 0 | 0 | D | 1 | 1 | D | 1 | 0 | D | 0 | 1 | 7 |
| 0 | ..... | 0 | 0 | 0 | 0 | 0 | 0 | 0 | 0 | 0 | D | 1 | 1 | D | 1 | 0 | 6 |
| 0 | ..... | 0 | 0 | 1 | D | 0 | 1 | D | 0 | 0 | 1 | 0 | 0 | D | 1 | 1 | 6 |
| 0 | ..... | 0 | 1 | 0 | D | 1 | 1 | D | 1 | 0 | 0 | 0 | 0 | 1 | 0 | 0 | 6 |
| 0 | ..... | 0 | 1 | 1 | D | 1 | 1 | D | 1 | 1 | D | 0 | 0 | 0 | 0 | 0 | 7 |
| 0 | ..... | 1 | 0 | 0 | 0 | 0 | 0 | D | 1 | 1 | D | 1 | 0 | D | 0 | 1 | 7 |
| 0 | ..... | ..... | ..... | ..... | ..... | ..... | ..... | ..... | ..... | ..... | ..... | ..... | ..... | ..... | ..... | ..... | ..... |

↑ RESETTING THE QUINARY COUNTER

D : don't care

FIG.11

SECOND EMBODIMENT : TRANSITION OF REFRESH OPERATION (TERNARY COUNTER)

| COUNT VALUE OF REFRESH | | | | | UPPER 3 BITS OF A ROW ADDRESS | | | | | | | | TOTAL NUMBER OF SELECTED WORD LINES (4 BANKS) |
|---|---|---|---|---|---|---|---|---|---|---|---|---|---|
| | | | | | BANK A | | BANK B | | BANK C | | BANK D | | |
| C13 | ..... | C2 | C1 | C0 | A12 | A13T A13N | A12 | A13T A13N | A12 | A13T A13N | A12 | A13T A13N | |
| 0 | ..... | 0 | 0 | 0 | 0 | 0  1 | 0 | 0  1 | 0 | 0  1 | 0 | 0  1 | 4 |
| 0 | ..... | 0 | 0 | 1 | 0 | 1  0 | 0 | 1  0 | 0 | 1  0 | 0 | 1  0 | 6 |
| 0 | ..... | 0 | 1 | 0 | 0 | 0  1 | 0 | 0  1 | 0 | 0  1 | 0 | 0  1 | 6 |
| 0 | ..... | 0 | 0 | 0 | 0 | 0  1 | 0 | 0  1 | 0 | 0  1 | 0 | 0  1 | 4 |
| 0 | ..... | 0 | 0 | 1 | 0 | 1  0 | 0 | 1  0 | 0 | 1  0 | 0 | 1  0 | 6 |
| 0 | ..... | 0 | 1 | 0 | 0 | 1  1 | 0 | 1  1 | 1 | 1  1 | 1 | 1  1 | 6 |
| ..... | ..... | ..... | ..... | ..... | ..... | ..... | ..... | ..... | ..... | ..... | ..... | ..... | ..... |

↑ RESETTING THE TERNARY COUNTER

SEMICONDUCTOR MEMORY DEVICE

BACKGROUND OF THE INVENTION

1. Field of the Invention

The present invention relates to a semiconductor memory device for controlling refresh operation for a memory cell array in normal operation, and particularly relates to a semiconductor memory device such as DRAM (Dynamic Random Access Memory) in which the memory cell array is divided into a plurality of banks and the refresh operation can be performed by selecting a plurality of word lines for each bank.

2. Description of the Related Art

Generally, refresh operation should be performed with a predetermined refresh period in order to hold data in a memory cell array of DRAM. In normal operation of DRAM, a row address is counted up by a refresh counter at every refresh interval specified in a specification, and the refresh operation is sequentially performed for the row address indicated by a count value. DRAM is generally divided into a plurality of banks and refresh operation is performed for each bank at the same time. For example, considering a case in which the refresh operation is performed for one of $2^m$ word lines each corresponding to a m-bit row address at every refresh interval in each bank, the refresh period of each memory cell is $2^m \cdot t$ (t: refresh interval). However, an increase in storage capacity of DRAM likely makes it difficult to ensure data retention characteristics of the memory cell in the refresh period $2^m \cdot t$. Therefore, it is desirable to ensure a refresh period conforming to an actual value of the data retention time of the memory cell by increasing the frequency of refresh operations.

As a measure against the problem, a configuration is employed in which a plurality of word lines is refreshed at the same time at every refresh interval in each bank (For example, see Japanese Patent Laid-Open No. 2003-187578). For example, one bit of the row address is set to a "don't care" state so that the bit becomes irrelevant (regardless of whether it is 0 or 1), and corresponding two word lines are selected to be refreshed, which can be refreshed at the same time. The count value of the refresh counter is assigned to each bit included in an (m−1) bit row address except the irrelevant bit, and is counted up sequentially so as to be supplied to each bank. Thereby, refresh operations may be performed $2^{m-1}$ times to complete refreshing all of $2^m$ word lines which can be designated by an m-bit row address, and thus the refresh period in this case is reduced by half.

In the above conventional configuration of DRAM, the number of word lines to be refreshed at every refresh interval is increased from one to two, and it is possible to reduce the refresh period by half. However, when reducing the refresh period by half, a situation is assumed in which the refresh period becomes too short for the actual value of the data retention time of the memory cell while the refresh period actually should have been slightly reduced. In other words, the refresh operation for one word line at every refresh interval is insufficient in terms of the data retention characteristics of the memory cell, while the refresh operation for two word lines at every refresh interval is too frequent and extra current is consumed. If the actual value of the data retention time of the memory cell corresponds to an average number of about 1.5 word lines at every refresh interval, it is difficult to adjust the refresh period so as to conform to the average number, thus it is a problem that current is unnecessarily consumed during the refresh operation.

Further, as a measure for appropriately adjusting the refresh period, one word line can be refreshed for each bank in a certain time zone, while two word lines can be refreshed for each bank in the other time zone. Such a measure can reduce average current in the refresh operation of DRAM in accordance with the refresh period, however cannot reduce peak current. That is, the peak current of DRAM is specified by current flowing at a timing to refresh two word lines at the same time in each bank. Thus, it is a problem that reliability of the refresh operation of DRAM is lowered by noise due to the peak current. Further, it is also a problem that circuit scale of a boost circuit and the like for driving the word line is required to be larger in accordance with the peak current.

BRIEF SUMMARY OF THE INVENTION

An object of the present invention is to provide a semiconductor memory device which is capable of finely adjusting a refresh period conforming to an actual value of data retention time of a memory cell without being restricted by a refresh specification and capable of reducing both peak current and average current in refresh operation so as to ensure high reliability with a smaller circuit scale.

An aspect of the present invention is a semiconductor memory device which performs a refresh operation sequentially for a word line to be selected based on a row address when receiving a refresh request at a predetermined interval, comprising: a memory cell array divided into M banks; a refresh counter for sequentially outputting a count value corresponding to the word line to be refreshed in response to the refresh request; and a row address converter for supplying row addresses different from one anther in at lest two banks among the M banks by converting the count value, wherein in the refresh operation performed at the predetermined refresh interval, a predetermined number of selected word lines are refreshed at the same time in at least two banks among the M banks in accordance with different patterns from one another, and the maximum value of the total number of the selected word lines refreshed at the same time for all the M banks is controlled to be lower than 2M.

According to the semiconductor device of the present invention, when receiving the refresh request, the count value output from the refresh counter is converted to row addresses different from one another for each of the M banks by the row address converter, and the converted row addresses are supplied to the respective banks so that the refresh operation for a predetermined number of selected word lines is performed. Then, the numbers of the selected word lines in each bank is according to different patterns, the total number of selected word lines to be refreshed at the same time in all banks changes, and the maximum value of the total number is controlled to be lower than 2M. Thereby, both the average current and the peak current in the refresh operation can be reduced, for example, relative to a case where two word lines are refreshed in each of the M banks. Accordingly, a reduction in consumption current in the refresh operation and suppression of influence of noise are achieved while ensuring the refresh period conforming to an actual value of the data retention time in the refresh operation of the semiconductor memory device.

In the present invention, one or two selected word lines may be refreshed at the same time in at least two banks among the M banks in accordance with different patterns from one another.

In the present invention, lower K bits of said refresh counter may form an N-ary counter.

In the present invention, a predetermined bit of the row address can be irrelevant, and said row address converter may be capable of switching between a refresh operation for one word line corresponding to a row address of which the predetermined bit is 0 or 1 and a refresh operation for two word lines corresponding to both row addresses of which the predetermined bit is irrelevant to be 0 and 1.

In the present invention, said row address converter may include: a shift register unit having K shift registers arranged in parallel to which respective lower K bits of said refresh counter are input; and M multiple selection units attached to the respective M banks, for supplying to the banks row addresses corresponding to the one or two selected word lines in accordance with different patterns from one another in at least two banks among the M banks based on a K-bit address signal output from predetermined positions of the K shift registers of said shift register unit.

In the present invention, each of the K shift registers may be an M−1 stage shift register for sequentially shifting one bit among the K bits, and K bits at the same position of the K shift registers may be respectively sent to each bank so that row addresses different from one another by one are supplied to the M banks.

In the present invention, said row address converter may include logic circuits for generating row addresses, of which the predetermined bit is not irrelevant in the M banks, in accordance with different patterns from one another in at least two banks based on lower K bits of said refresh counter.

As described above, according to the present invention, a predetermined number of selected word lines are refreshed at the same time by supplying the row addresses in accordance with different patterns from one another, and the total number of selected word lines to be refreshed in all banks are controlled to be lower than 2M. Therefore, the total number of word lines to be refreshed at every time in the entire semiconductor memory device is appropriately adjusted, and the average current and the peak current in the refresh operation can be both reduced. Accordingly, a semiconductor memory device capable of reducing consumption current in the refresh operation and of suppressing influence of noise due to the peak current can be realized with a relatively small circuit scale, while ensuring the refresh period optimized for data retention characteristics.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which:

FIG. 4 is a diagram showing a transition of a refresh operation performed corresponding to the setting of N=6 in the first embodiment;

FIG. 6 is a diagram showing a transition of a refresh operation performed corresponding to a setting of N=7 in the first embodiment;

FIG. 8 is a diagram showing a transition of a refresh operation performed corresponding to a setting of N=5 in the first embodiment;

FIG. 11 is a diagram showing a transition of a refresh operation performed corresponding to a setting of N=3 in the second embodiment.

DETAILED DESCRIPTION OF THE INVENTION

Preferred embodiments of the present invention will be described with reference to the accompanying drawings. Hereinafter, two embodiments having different configurations will be described in which the present invention is assumed to be applied to DRAM having four banks as an example of a semiconductor device.

First Embodiment

Figure 1:
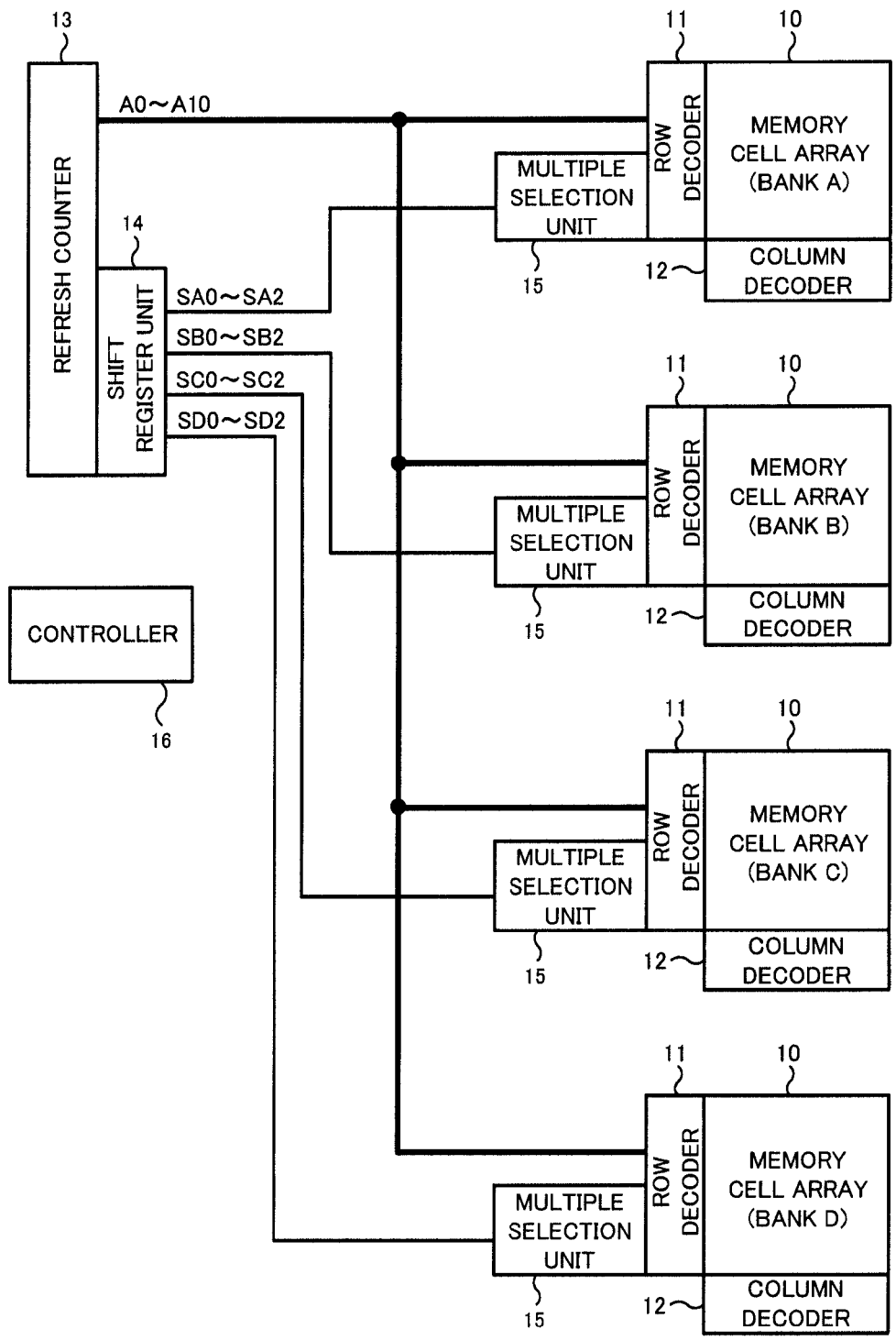
FIG. 1 is a block diagram showing a principal configuration of a DRAM of a first embodiment.

Configuration and operation of DRAM of a first embodiment will be described first. FIG. 1 is a block diagram showing a principal configuration of the DRAM of the first embodiment. In the DRAM as shown in FIG. 1, a memory cell array 10 including many memory cells is arranged to be divided into four banks. The respective banks denoted as banks A, B, C and D of the memory cell array 10 has the same storage capacity and the same configuration. The memory cell array 10 includes many memory cells formed at intersections between a plurality of word lines and a plurality of bit lines arranged in a matrix form. Read and write operations for the four banks A, B, C and D can be controlled individually. A bank selection signal for selecting the four banks in normal operation is input from outside.

Row decoders 11 and column decoders 12 are arranged on the periphery of the memory cell array 10 corresponding to the four banks. Each row decoder 11 selects a word line corresponding to a designated row address, and each column decoder 12 selects a bit line corresponding to a designated column address. In the normal operation, an arbitrary memory cell can be selected by the row decoder 11 and the column decoder 12 of a selected bank.

In FIG. 1, a refresh counter 13, a shift register unit 14 attached to the refresh counter 13, four multiple selection units 15 each attached to each row decoder 11 of each bank, and a controller 16 are shown as a configuration related to the refresh operation of the first embodiment. Among these, the controller 16 controls the entire refresh operation, and sends control signals (not shown) to various parts in response to a refresh command from outside. In addition, an actual DRAM has many constituent elements used in the normal operation, but which are omitted in FIG. 1.

The refresh counter 13 sequentially outputs a count value corresponding to a row address of a word line to be selected as a refresh target when receiving the refresh command. Upper 11 bits of the count value of the refresh counter 13 are supplied to each bank as lower 11 bits (A0 to A10) of the row address. Further, lower three bits of the count value of the refresh counter 13 are input to the shift register unit 14. The shift register unit 14 includes three 3-bit shift registers arranged in parallel, and sends 3-bit address signals SA0 to SA2, SBC to SB2, SC0 to SC2, and SDC to SD2 to the banks A, B, C and D respectively. The address signals have values shifted one by one relative to each other in the arrangement order of the banks, but its specific operation will be described later.

The multiple selection unit 15 attached to each bank outputs upper three bits A11 to A13 of the row address by using the address signal output from the shift register unit 14. Here, the uppermost bit A13 of the row address can be irrelevant during the refresh operation, and there are two cases, in one of which one word line corresponding to a row addresses of A13=0 or of A13=1 is selected, and in the other of which two word lines corresponding to the both row addresses regardless of whether A13 is 0 or 1 (irrelevant) are multiply selected. One or two word lines are selected to be refreshed in each bank in accordance with the timing of the refresh operation.

The shift register unit 14 and the four multiple selection units 15 together function as a row address converter of the present invention, and operates to supply the row address corresponding to one or two selected word lines to each bank in accordance with different patterns, as described later.

In an actual layout in the configuration of DRAM, one word line corresponding to one row address may be configured as a plurality of lines dividedly arranged in a plurality of areas. However, if the lines are dividedly arranged in the layout, a case of one word line corresponding to one row address will be described hereinafter.

Figure 2:
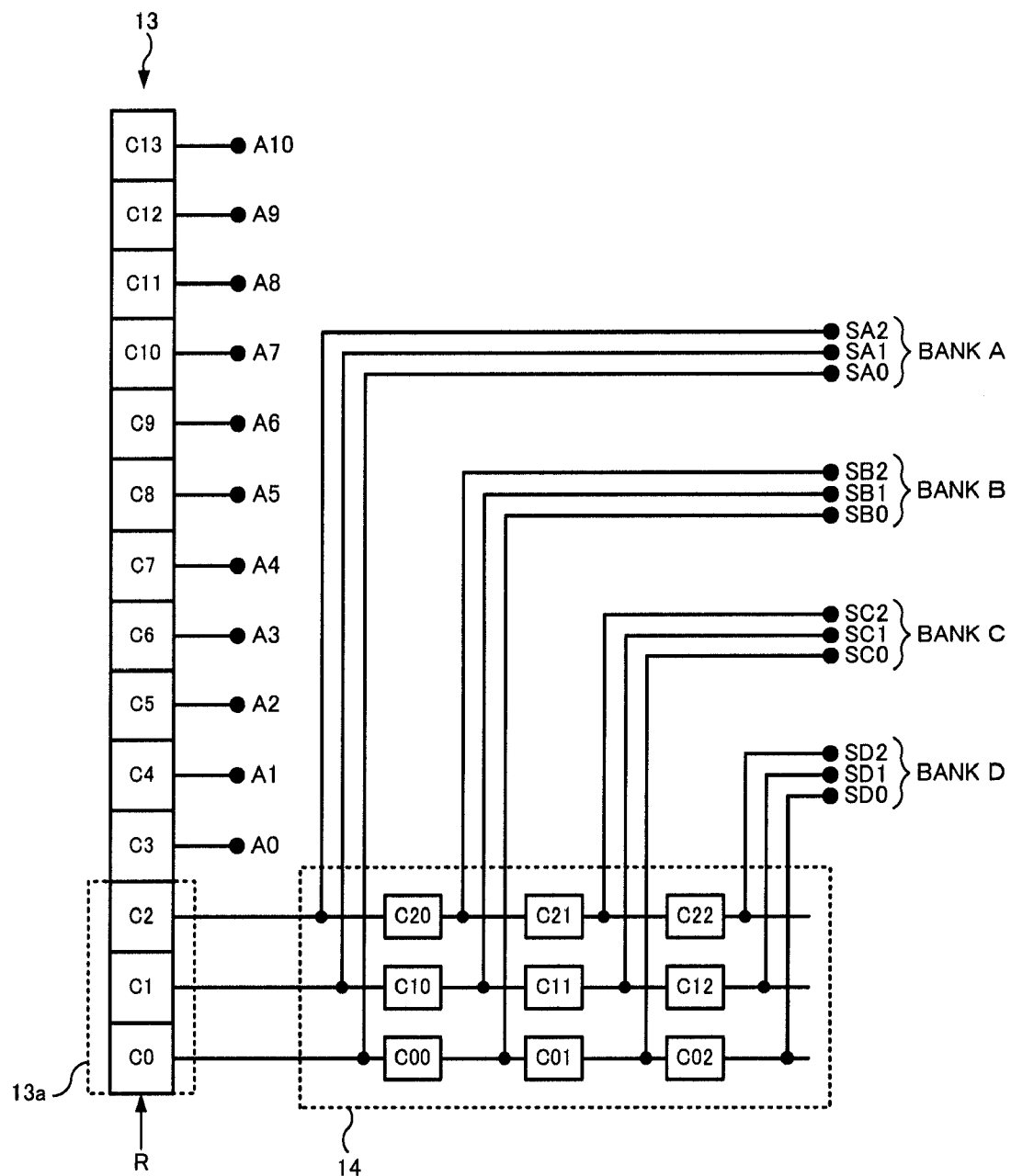
FIG. 2 is a diagram showing a configuration of a refresh counter and a shift register unit of the first embodiment.

Next, configuration and operation of the refresh counter 13 and the shift register unit 14 of the first embodiment will be described with reference to FIG. 2. As shown in FIG. 2, the refresh counter 13 includes counters (C0 to C13) connected in 14 stages and sequentially counts up a 14-bit count value. Upper 11 bits C3 to C13 of the count value of the refresh counter 13 are assigned to lower 11 bits A0 to A10 of the row address. Meanwhile, lower three bits C0 to C2 of the refresh counter 13 are coupled to an input-side of the shift register unit 14. In addition, a refresh request signal R indicating a timing to perform the refresh operation is supplied to the refresh counter 13 from the controller 16.

In FIG. 2, the lower three bits C0 to C2 of the refresh counter 13 form an N-ary counter 13a. For example, values such as N=5, 6 and 7 can be set. Thereby, after three bits of the N-ary counter 13a are counted up within a range from 0 to N−1, the count value is reset and returns to 0 at next N and subsequently the same operation is repeated.

The shift register unit 14 includes a 3-stage shift register (C00, C01, C02) for shifting the bit C0, a 3-stage shift register (C10, C11, C12) for shifting the bit C1, and a 3-stage shift register (C20, C21, C22) for shifting the bit C2, respectively, of the lower three bits of the refresh counter 13. As shown in FIG. 2, the input sides of respective first stages C00, C10 and C20 are coupled to the bank A as 3-bit address signals SA0, SA1 and SA2. The output sides of the respective first stages C00, C10 and C20 are coupled to the bank B as 3-bit address signals SB0, SB1 and SB2. The output sides of respective second stages C01, C11 and C21 are coupled to the bank C as 3-bit address signals SC0, SC1 and SC2. The output sides of respective third stages C02, C12 and C22 are coupled to the bank D as 3-bit address signals SD0, SD1 and SD2.

Since a connection relation of the shift register unit 14 is determined in the above manner, address signals having different timings can be supplied to the banks A, B, C and D. That is, in the refresh operation, lower three bits of the latest count value of the refresh counter 13 can be supplied to the bank A, lower three bits of the second latest count value can be supplied to the bank B, lower three bits of the third latest count value can be supplied to the bank C, and lower three bits of the fourth latest count value can be supplied to the bank D.

Figure 3:
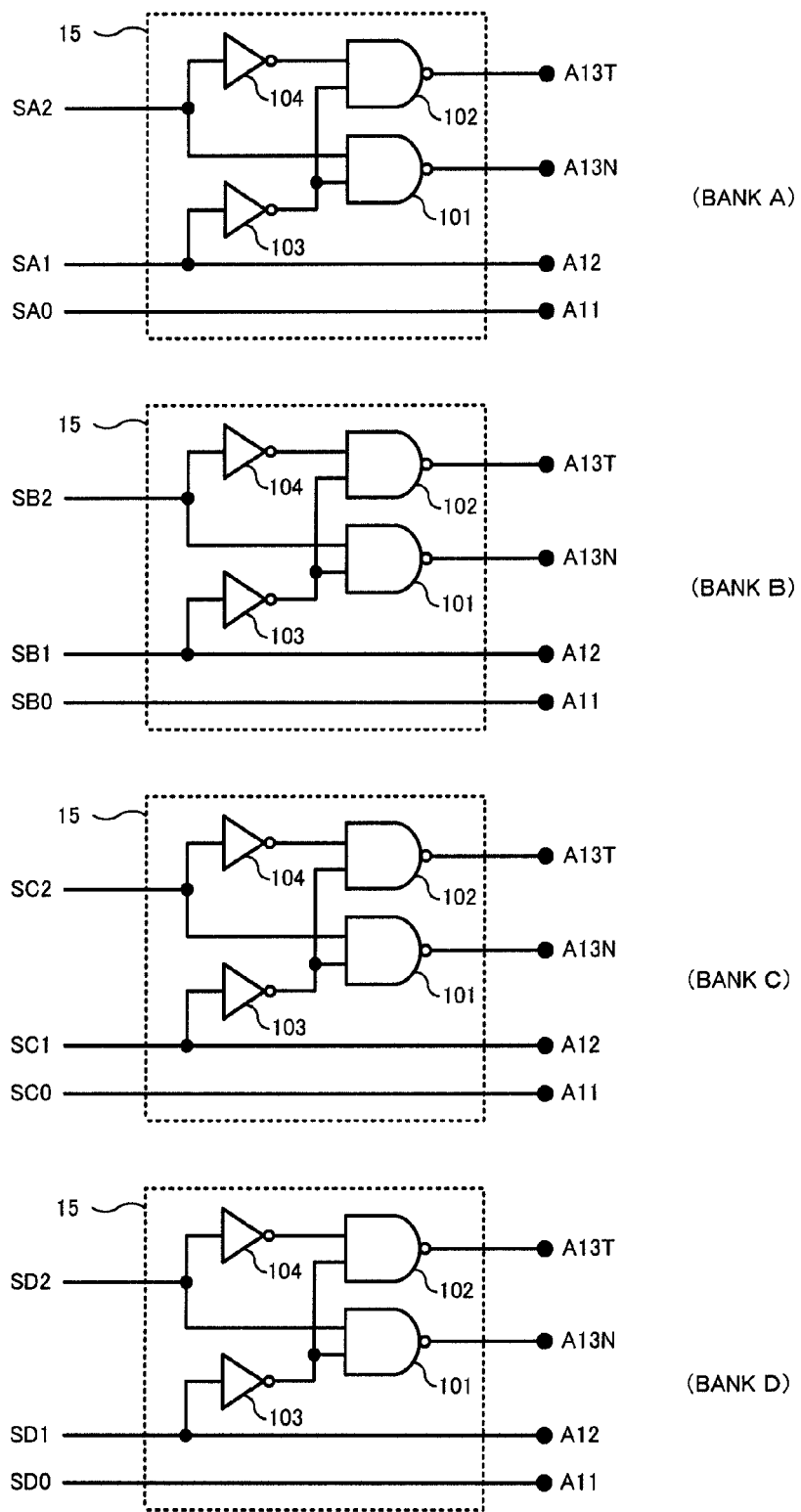
FIG. 3 is a diagram showing a configuration of multiple selection units corresponding to a setting of N=6 in the first embodiment.

Next, configuration and operation in a case where the N-ary counter 13a is a senary counter (setting of N=6) in the first embodiment will be described. FIG. 3 is a diagram showing a configuration of the multiple selection units 15 corresponding to the setting of N=6. The multiple selection units 15 have the same configuration for the four banks, so the multiple selection unit 15 for the bank A will be representatively described. As shown in FIG. 3, the multiple selection unit 15 includes two NAND gates 101 and 102, and two inverters 103 and 104.

The address signal SA0 is directly used as the bit A11 of the row address, and the address signal SA1 is directly used as the bit A12 of the row address. Meanwhile, an inverted signal of the address signal SA1 through the inverter 103 and the address signal SA2 are input to the NAND gate 101, and an output thereof becomes a bit A13N on the "not" side of the bit A13 of the row address. Further, the inverted signal of the address signal SA1 through the inverter 103 and an inverted signal of the address signal SA2 through the inverter 104 are input to the NAND gate 102, and an output thereof becomes a bit A13T on the "true" side of the bit A13 of the row address.

In FIG. 3, by paying attention to two bits A13T and A13N, one word line corresponding to a row address of the uppermost bit A13=0 is selected when A13T=0 and A13N=1. Further, one word line corresponding to a row address of the uppermost bit A13=1 is selected when A13T=1 and A13N=0. On the other hand, two word lines corresponding to both row addresses of the uppermost bit A13 is 0 or 1 (don't care) are selected when A13T=1 and A13N=1. In the case of FIG. 3, both the bits A13T and A13N become 1 when the address signal SA1 is 1.

FIG. 4 is a diagram showing a transition of the refresh operation performed corresponding to the setting of N=6. In FIG. 4, changes in upper three bits A11, A12 and A13 of the row address are shown for the respective banks, when the count value of the refresh counter 13 starts from 0 and is sequentially counted up at a predetermined refresh interval. The refresh interval is set to, for example, 7.8 μs according to the specification. Further in FIG. 4, the total numbers (sum) of the selected word lines of all banks at each refresh interval are shown. Since the N-ary counter 13a is set to N=6, the lower three bits of the count value return to 000 (binary) at a timing subsequent to 101 (binary), and the row address of each bank changes in accordance with six patterns.

One word line is selected in each of three banks at each of the first and third refresh intervals, while two word lines are selected in one bank where the uppermost bit A13 is controlled to be in a "don't care" state by the multiple selection unit 15, and thus five word lines in total are selected. Further, one word line is selected in each of two banks at each of the fourth to sixth refresh interval, while two word lines are selected in each of the other two banks, and thus six word lines in total are selected. Meanwhile, since one word line is selected in each of all four banks at the second refresh interval, four word lines in total are selected in all banks. In this manner, the total number of selected word lines changes in the order of 5, 4, 5, 6, 6, 6.

The N-ary counter 13a is reset after the sixth refresh interval, and therefore the same pattern as for the first to sixth refresh intervals is repeated at the seventh and subsequent refresh intervals. Accordingly, the maximum value of the total number of selected word lines is six as shown in FIG. 4. If two word lines are selected in each of the four banks, the above maximum value is smaller by two because the total number of selected word lines is eight. Thereby, peak current in the refresh operation can be reduced by approximately ¾. In FIG. 4, the average value of the total number of selected word lines per refresh is about 5.33, and thus the refresh period can be extended about 1.5 times than the case of selecting two word lines at every time in each of all the four banks.

Figure 5:
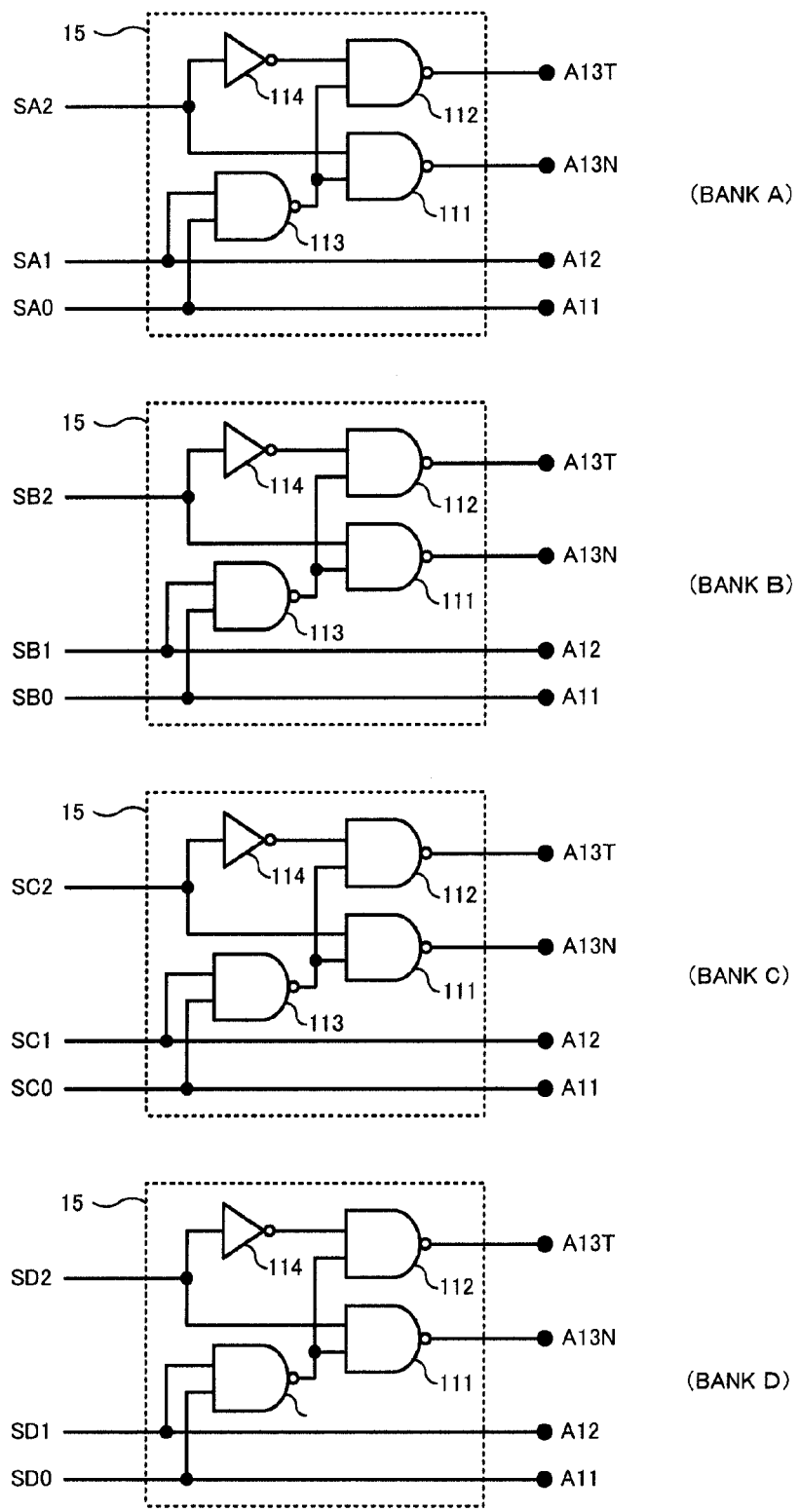
FIG. 5 is a diagram showing a configuration of multiple selection units corresponding to a setting of N=7 in the first embodiment.

FIG. 5 is a diagram showing a configuration of the multiple selection units 15 corresponding to the setting of N=7 (septenary counter). The multiple selection units 15 have the same configuration for the four banks, so the multiple selection unit 15 for the bank A will be representatively described. As shown in FIG. 5, the multiple selection unit 15 includes three NAND gates 111, 112 and 113 and an inverter 114. By comparing FIG. 5 with FIG. 3, the NAND gate 113 is different, while other parts are common. The address signals SA0 and SA1 are input to the NAND gate 113, and the output thereof is input to two NAND gates 111 and 112.

As described above, one word line corresponding to the row address of the uppermost bit A13=0 is selected when A13T=0 and A13N=1, and one word line corresponding to the row address of the uppermost bit A13=1 is selected when A13T=1 and A13N=0. Meanwhile, two word lines corresponding to the row addresses of the uppermost bit A13=0 and 1 (don't care) are selected when A13T=1 and A13N=1. In the case of FIG. 5, both bits A13T and A13N are 1 when both the address signals SA0 are SA1 are 1.

FIG. 6 is a diagram showing a transition of the refresh operation performed corresponding to the setting of N=7. Respective notations in FIG. 6 have the same meanings as those in FIG. 4. In this case, since the N-ary counter 13a is set to N=7, lower three bits of the count value return to 000 (binary) at a timing subsequent to 110 (binary), and the row address of each bank changes in accordance with seven patterns. One word line is selected in each of the four banks at each of the first to third refresh intervals, and thus four word lines in total are selected in all banks. At each of the fourth to seventh refresh intervals, one word line is selected in each of three banks while two word lines are selected in one bank, and thus five word lines in total are selected in all banks. In this manner, the total number of selected word lines changes in the order of 4, 4, 4, 5, 5, 5, 5.

The N-ary counter 13a is reset after the seventh refresh interval, and therefore the same pattern as for the first to seventh refresh intervals is repeated at the eighth and subsequent refresh intervals. Accordingly, the maximum value of the total number of selected word lines is five as shown in FIG. 6, which is smaller by three than the above eight. Thereby, peak current in the refresh operation can be reduced by approximately ⅝. In FIG. 6, the average value of the total number of selected word lines per refresh is about 4.57, and thus the refresh period can be extended about 1.75 times than the case of selecting two word lines at every time in each of all the four banks.

Figure 7:
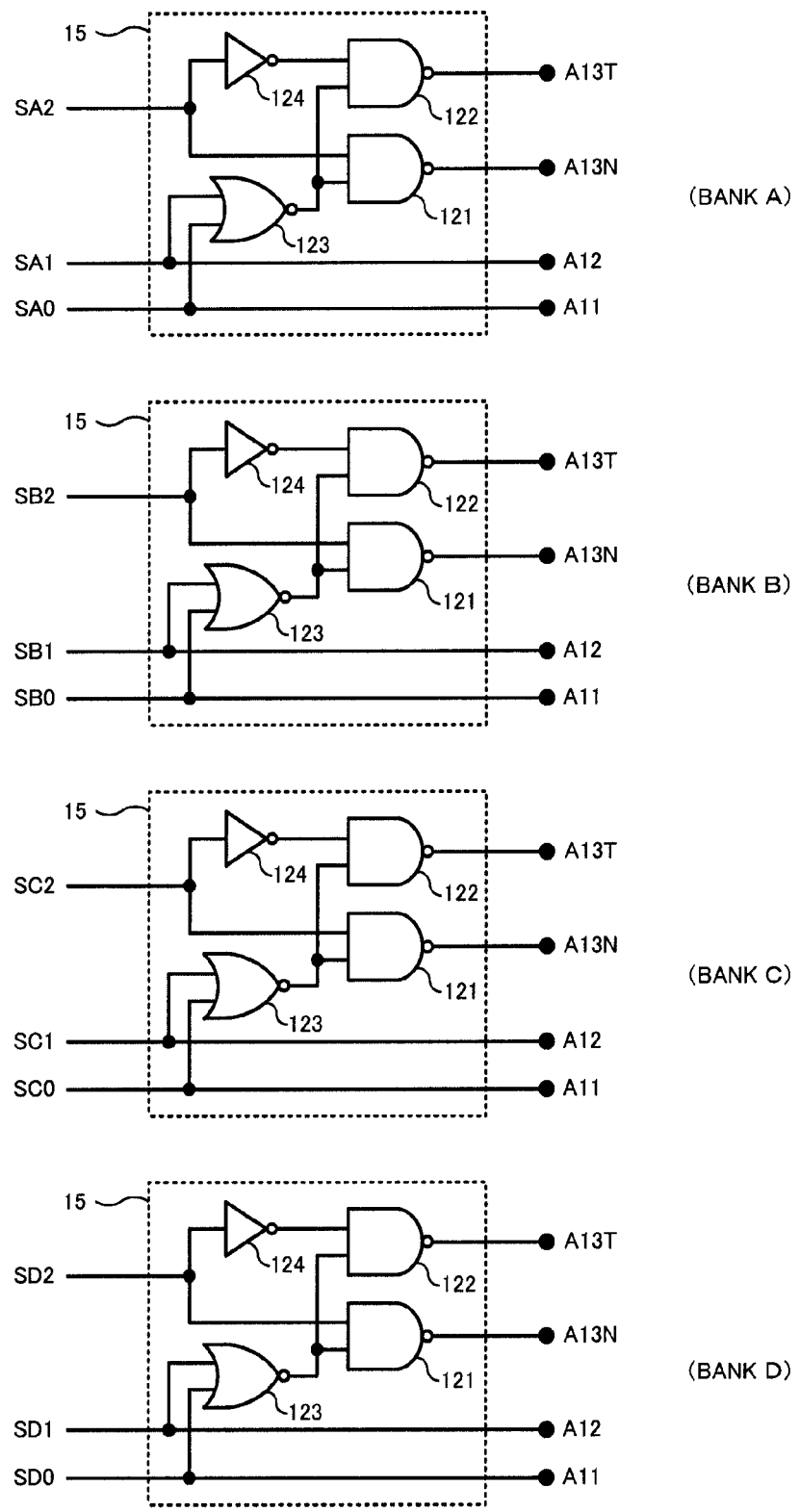
FIG. 7 is a diagram showing a configuration of multiple selection units corresponding to a setting of N=5 in the first embodiment.

FIG. 7 is a diagram showing a configuration of the multiple selection units 15 corresponding to the setting of N=5 (quinary counter). The multiple selection units 15 have the same configuration for the four banks, so the multiple selection unit 15 for the bank A will be representatively described. As shown in FIG. 7, the multiple selection unit 15 includes two NAND gates 121 and 122, an OR gate 123 and an inverter 124. By comparing FIG. 7 with FIG. 5, a difference exists in that the NAND gate 113 is replaced with the OR gate 123, while other parts are common. The address signals SA0 and SA1 are input to the OR gate 123, and the output thereof is input to two NAND gates 121 and 122.

As described above, one word line corresponding to the row address of the uppermost bit A13=0 is selected when A13T=0 and A13N=1, and one word line corresponding to the row address of the uppermost bit A13=1 is selected when A13T=1 and A13N=0. Meanwhile, two word lines corresponding to the row addresses of the uppermost bit A13=0 and 1 (don't care) are selected when A13T=1 and A13N=1. In the case of FIG. 7, both bits A13T and A13N are 1 when either or both the address signals SA0 are SA1 are 1.

FIG. 8 is a diagram showing a transition of the refresh operation performed corresponding to the setting of N=5. Respective notations in FIG. 8 have the same meanings as those in FIGS. 4 and 6. In this case, since the N-ary counter 13a is set to N=5, lower three bits of the count value return to 000 (binary) at a timing subsequent to 100 (binary), and the row address of each bank changes in accordance with five patterns. At each of the first to third refresh intervals, one word line is selected in each of two banks while two word lines are selected in other banks, and thus six word lines in total are selected in all banks. At the fourth or fifth refresh intervals, one word line is selected in one bank while three word lines are selected in other three banks, and thus seven word lines in total are selected in all banks. In this manner, the total number of selected word lines changes in the order of 6, 6, 6, 7, 7.

The N-ary counter 13a is reset after the fifth refresh interval, and therefore the same pattern as for the first to fifth refresh intervals is repeated at the sixth and subsequent refresh intervals. Accordingly, the maximum value of the total number of selected word lines is seven as shown in FIG. 8, which is smaller by one than the above eight. Thereby, peak current in the refresh operation can be reduced by approximately ⅞. In FIG. 8, the average value of the total number of selected word lines per refresh is about 6.4, and thus the refresh period can be extended about 1.25 times than the case of selecting two word lines at every time in each of all the four banks.

Second Embodiment

Figure 9:
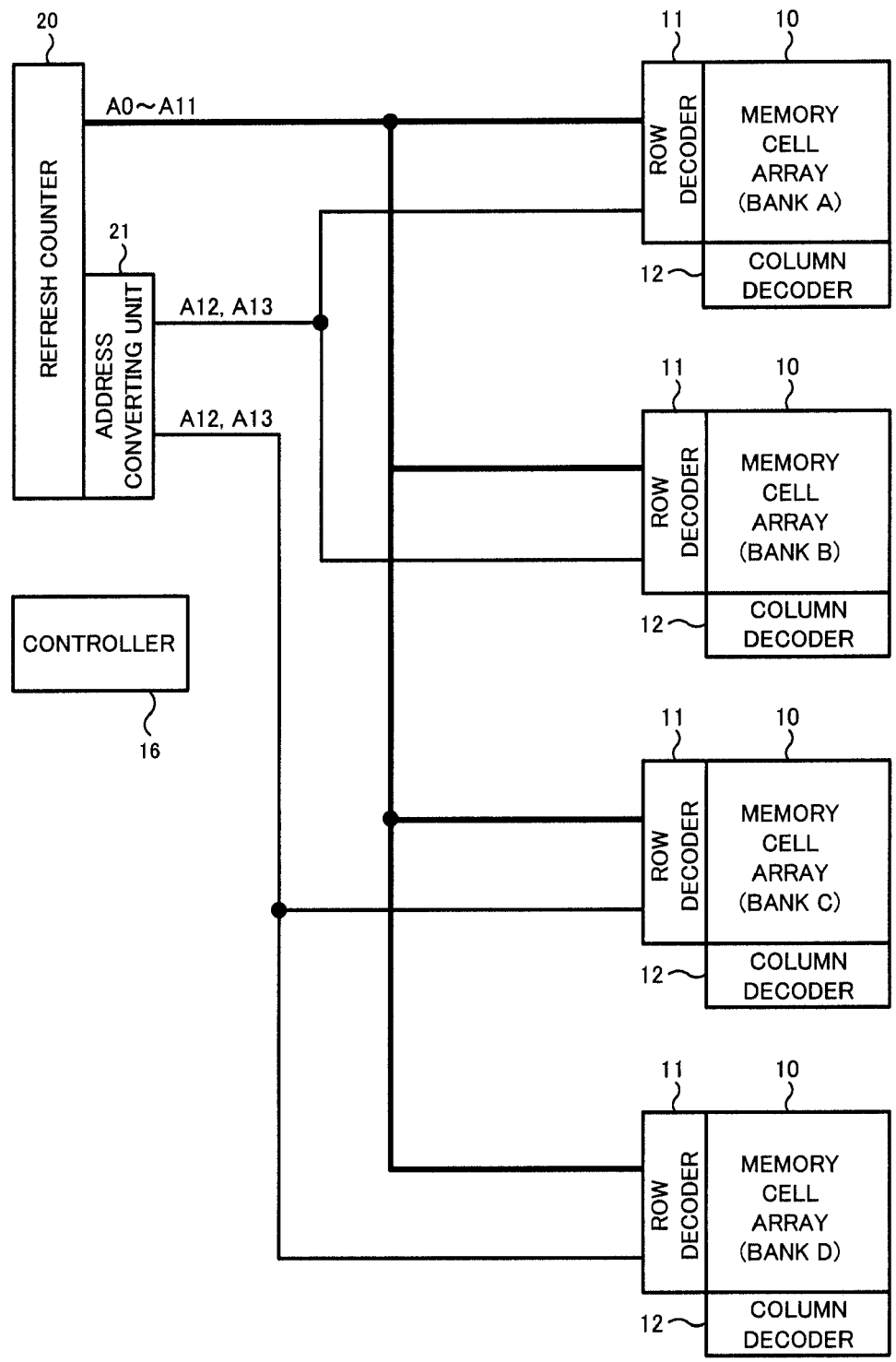
FIG. 9 is a block diagram showing a principal configuration of a DRAM of a second embodiment.

Next, configuration and operation of DRAM of a second embodiment will be described. FIG. 9 is a block diagram showing a principal configuration of the DRAM of the second embodiment. In the configuration of FIG. 9, a memory cell array 10 divided into four banks A, B, C and D, row decoders 11, column decoders 12 and a controller 16 are the same as those in FIG. 1 of the first embodiment. Meanwhile, there are provided a refresh counter 20 and an address converting unit 21 in FIG. 9, which are constituent elements corresponding to the refresh counter 13, the shift register unit 14 and the multiple selection units 15.

The refresh counter 20 sequentially outputs a count value corresponding to a row address of a word line to be selected as a refresh target, as in FIG. 1. However, it is different from FIG. 1 in that upper 12 bits of the count value is supplied to each bank as lower 12 bits (A0 to A11) of the row address. Further, lower two bits of the count value of the refresh counter 20 are input to the address converting unit 21 attached to the refresh counter 20. The address converting unit 21 includes logic circuits for sending upper two bits A12 and A13 of the row address commonly supplied to two banks A and B, and for sending upper two bits A12 and A13 of the row address commonly supplied to the other two banks C and D, by using lower two bits of the count value of the refresh counter 20. The uppermost bit A13 sent form the address converting unit 21 is composed of a bit A13T on the "true" side and a bit A13N on the "not" side because the bit A13 can be irrelevant during the refresh operation as described above.

Figure 10:
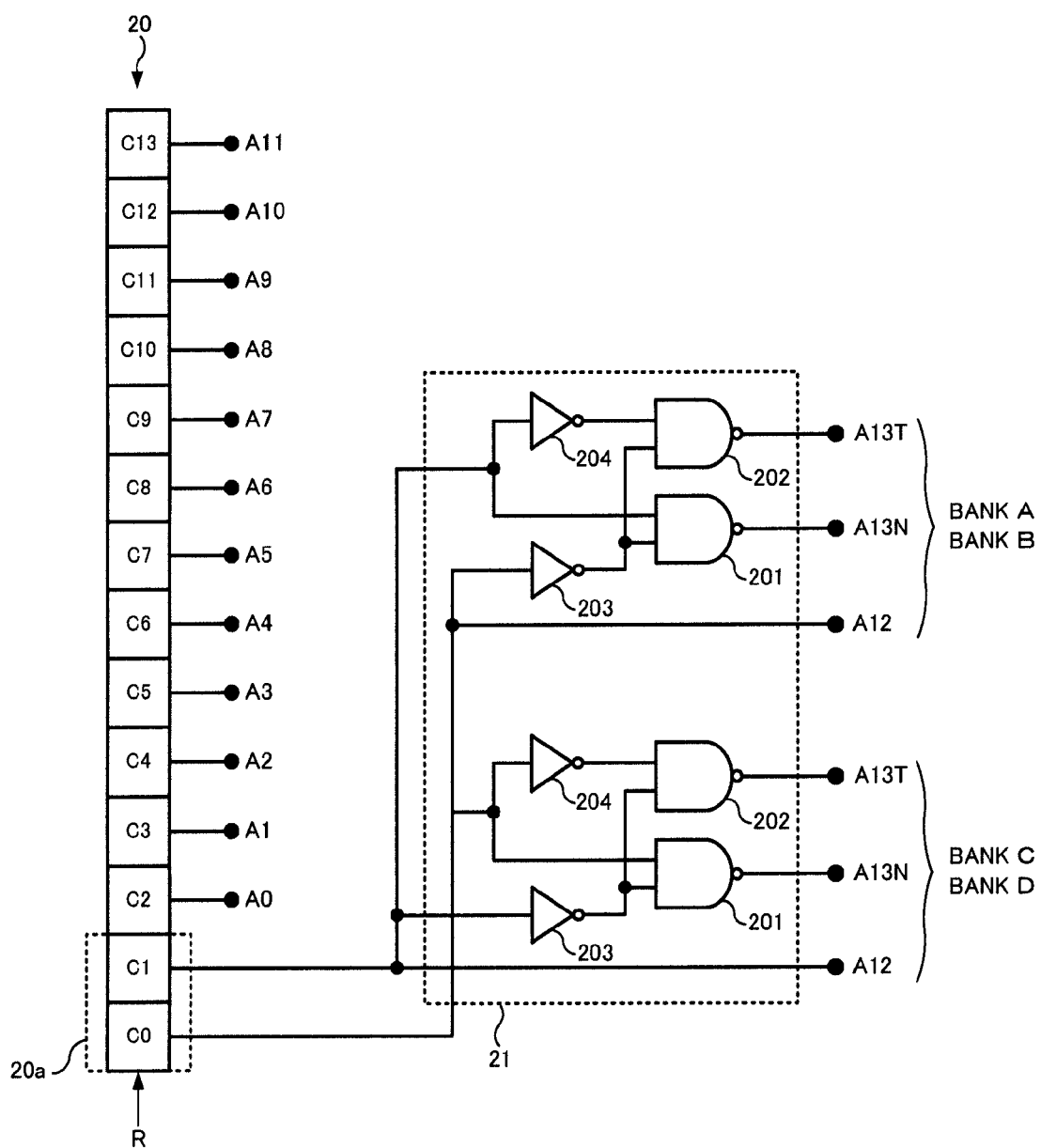
FIG. 10 is a diagram showing a configuration of a refresh counter and a address converting unit corresponding to a setting of N=3 in the second embodiment.

Next, configuration and operation of the refresh counter 20 and the address converting unit 21 of the second embodiment will be described with reference to FIG. 10. As shown in FIG. 10, the refresh counter 20 includes counters (C0 to C13) connected in 14 stages as in FIG. 2, and a 14-bit count value is sequentially counted up. Upper 12 bits C2 to C13 of the count value of the refresh counter 20 are assigned to lower 12 bits A0 to A11 of the row address. Meanwhile, lower two bits C0 and C1 of the refresh counter 20 are coupled to an input-side of the address converting unit 21. In addition, a refresh request signal R indicating a timing to perform the refresh operation is supplied to the refresh counter 20 from the controller 16.

In FIG. 10, the lower two bits C0 and C1 of the refresh counter 20 form an N-ary counter 20a. For example, a value such as N=2 or 3 can be set. Thereby, after three bits of the N-ary counter 20a are counted up within a range from 0 to N−1, the count value is reset and returns to 0 at next N and subsequently the same operation is repeated.

In the address converting unit 21, a circuit portion corresponding to two banks A and B, and a circuit portion corresponding to two banks C and D have the same configuration, in which two NAND gates 201 and 202, and two inverters 203 and 204 are provided respectively. In FIG. 10, a circuit configuration of the address converting unit 21 in a case where the N-ary counter 20a is a ternary counter (setting of N=3) is shown.

As shown in FIG. 10, a bit C0 of the refresh counter 20 becomes the bit A12 of the row address on the sides of banks A and B, and a bit C1 of the refresh counter 20 becomes the bit A12 of the row address on the sides of banks C and D. Meanwhile, an inverted signal of the bit C0 (C1) through the inverter 203 and the bit C1 (C0) are input to the NAND gate 201, and an output thereof becomes a bit A13N on the "not" side of the bit A13 of the row address. An inverted signal of the bit C0 (C1) through the inverter 203 and an inverted signal of the bit C1 (C0) through the inverter 204 are input to the NAND gate 202, and an output thereof becomes a bit A13T on the "true" side of the bit A13 of the row address.

FIG. 11 is a diagram showing a transition of the refresh operation performed corresponding to the setting of N=3. In FIG. 11, changes in upper two bits A12 and A13 (A13T and A13N) of the row address are shown for the respective banks, when the count value of the refresh counter 20 starts from 0 and is sequentially counted up at a predetermined refresh interval. Further, the total numbers of the selected word lines of all banks at each refresh interval are shown. Since the N-ary counter 13a is set to N=3, the lower two bits of the count value return to 00 (binary) at a timing subsequent to 10 (binary), and the row address of each bank changes in accordance with three patterns.

Based on the configuration of the address converting unit 21 of FIG. 10, the row addresses of banks A and B change in the same pattern as each other, and the row addresses of banks C and D change in the same pattern as each other. One word line is selected in every bank at the first refresh interval. Meanwhile, two word lines are selected in each of banks A and B at the second refresh interval, and two word lines are selected in each of banks C and D at the third refresh interval. In this manner, the total number of selected word lines changes in the order of 4, 6, 6, 4.

The N-ary counter 13a is reset after the third refresh interval, and therefore the same pattern as for the first to third refresh intervals is repeated at the fourth and subsequent refresh intervals. Accordingly, the maximum value of the total number of selected word lines is six as shown in FIG. 11, which is smaller by two than the above eight. Thereby, peak current in the refresh operation can be reduced by approximately ¾. In FIG. 11, the average value of the total number of selected word lines per refresh is 5, and thus the refresh period can be extended about 1.25 times than the case of selecting two word lines at every time in each of all the four banks.

As described above, by employing the first or second embodiment, the total number of selected word lines to be refreshed is appropriately set, and both the average current and the peak current can be reduced in the refresh operation. Accordingly, current flowing in the refresh operation can be reduced, the influence of noise due to the peak current can be suppressed to improve reliability, and the circuit scale of a boost circuit and the like for word lines can be smaller. In this case, the refresh period is set conforming to the actual value of the memory cell, and the pattern of the row address which is converted to optimize the total number of selected word lines at each refresh interval can be freely set.

In addition, a case where the memory cell array 10 is divided into four banks A, B, C and D has been described in the embodiments. However, the present invention can be widely applied to a case where the memory cell array 10 is divided not only into four banks, but also into M (M is an integer greater than or equal to 2) banks. Further, settings of the numbers of stages of the refresh counters 13 and 20, or a setting of the N-ary counter having K bits of the refresh counter 13 or 20 (a setting of K and N) can be freely changed.

The present invention is not limited to the above described embodiments, and various variations and modifications may be possible without departing from the scope of the present invention.

This application is based on the Japanese Patent application No. 2006-335159 filed on Dec. 12, 2006, entire content of which is expressly incorporated by reference herein.

What is claimed is:

1. A semiconductor memory device which performs a refresh operation sequentially for a word line to be selected based on a row address when receiving a refresh request at a predetermined interval, comprising:
 a memory cell array divided into M (M is an integer greater than or equal to 2) banks;
 a refresh address counter for sequentially outputting a count value corresponding to the word line to be refreshed in response to the refresh request; and
 a row address converter for supplying row addresses different from one another in at least two banks among the M banks by converting the count value,
 wherein in at least one of a plurality of refresh cycles, a predetermined word line of each of the M banks and another word line of at least one of the banks which are less than M are refreshed, those word lines are refreshed by the refresh address counter and the row address converter, and a total number P of selected word lines to be refreshed satisfies a relation M<P<2M.

2. The semiconductor memory device according to claim 1, wherein lower K bits of the refresh address counter form an N-ary counter (a relation $2<N<2^k$ is satisfied) and an output of the N-ary counter is set to the counter value of the refresh address counter.

3. The semiconductor memory device according to claim 2, wherein the row address converter includes at least K shift registers,
 and each of the K shift registers is an (M−1)-stage shift register for sequentially shifting one bit among the K bits, and K bits at the same position of the K shift registers are respectively sent to each of the banks so that row addresses different from one another by 1 are supplied to the M banks.

4. The semiconductor memory device according to claim 2, wherein each of the M banks is refreshed in accordance with N patterns repeated by N times with the row addresses different from one another.

5. The semiconductor memory device according the claim 2, wherein one or two selected word lines are refreshed at the same time in accordance with the N patterns different from one another in at least two banks among the M banks.

6. The semiconductor memory device according to claim 2, wherein a predetermined bit of the row address corresponding to the K bits can be irrelevant, and the row address converter is capable of switching between a refresh operation for one word line corresponding to a row address of which the predetermined bit is 0 or 1 and a refresh operation for two word lines corresponding to both row addresses of which the predetermined bit is irrelevant to be 0 and 1.

7. The semiconductor memory device according the claim 1, wherein the row address converter includes:
a shift register unit having K shift registers arranged in parallel to which respective lower K bits of the refresh address counter are input; and
M multiple selection units attached to the respective M banks, for supplying to the banks one or more row addresses corresponding to the one or two selected word lines in accordance with the N patterns different from one another in a least two banks among the M banks based on a K-bit address signal output from predetermined positions of the K shift registers of the shift register unit.

8. The semiconductor memory device according to claim 7, wherein each of the K shift registers is an M−1 stage shift register for sequentially shifting one bit among the K bits, and K bits at the same position of the K shift registers are respectively sent to each bank so that row addresses different from one another by 1 are supplied to the M banks.

9. The semiconductor memory device according to claim 6, wherein the row address converter includes logic circuits for generating row addresses, of which the predetermined bit is not irrelevant in the M banks, in accordance with the N patterns different from one another in at least two banks based on lower K bits of the refresh address counter.

10. A semiconductor memory device which performs a refresh operation sequentially for a word line to be selected based on a row address when receiving a refresh request at a predetermined interval, comprising:
a memory cell array divided into M (M is an integer greater than or equal to 2) banks;
a refresh counter for sequentially outputting a count value corresponding to the word line to be refreshed in response to the refresh request; and
a row address converter for supplying row addresses different from one another in at least two banks among the M banks by converting the count value,
wherein in the refresh operation performed at the predetermined refresh interval, a predetermined number of selected word lines are refreshed at the same time in at least two banks among the M banks in accordance with different patterns from one another, and the maximum value of the total number of the selected word lines refreshed at the same time for all the M banks is controlled to be lower than 2M,
one or two selected word lines are refreshed at the same time in at least two banks among the M banks in accordance with different patterns from one another,
lower K (K is an integer greater than or equal to 2) bits of the refresh counter form an N-ary counter,
a predetermined bit of the row address can be irrelevant, and the row address converter is capable of switching between a refresh operation for one word line corresponding to a row address of which the predetermined bit is 0 or 1 and a refresh operation for two word lines corresponding to both row addresses of which the predetermined bit is irrelevant to be 0 and 1,
and the row address converter includes:
a shift register unit having K shift registers arranged in parallel to which respective lower K bits of the refresh counter are input; and
M multiple selection units attached to the respective M banks, for supplying to the banks one or more row addresses corresponding to the one or two selected word lines in accordance with different patterns from one another in at least two banks among the M banks based on a K-bit address signal output from predetermined positions of the K shift registers of said shift register unit.

* * * * *